United States Patent
Jang et al.

(10) Patent No.: US 12,419,037 B2
(45) Date of Patent: Sep. 16, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Semyeong Jang, Hefei (CN); Joonsuk Moon, Hefei (CN); Deyuan Xiao, Hefei (CN); Jo-Lan Chin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 488 days.

(21) Appl. No.: 17/950,245

(22) Filed: Sep. 22, 2022

(65) Prior Publication Data

US 2023/0019492 A1 Jan. 19, 2023

Related U.S. Application Data

(63) Continuation of application No. PCT/CN2022/104041, filed on Jul. 6, 2022.

(30) Foreign Application Priority Data

Jan. 7, 2022 (CN) .......................... 202210018352.4

(51) Int. Cl.
*H10B 12/00* (2023.01)
*H10D 30/63* (2025.01)

(52) U.S. Cl.
CPC .......... *H10B 12/315* (2023.02); *H10B 12/05* (2023.02); *H10B 12/482* (2023.02)

(58) Field of Classification Search
CPC .... H10B 12/315; H10B 12/05; H10B 12/482; H10B 12/0335; H10D 30/025; H10D 30/63; H10D 62/822
See application file for complete search history.

(56) References Cited

U.S. PATENT DOCUMENTS

| | | |
|---|---|---|
| 6,881,994 B2 | 4/2005 | Lee |
| 6,897,514 B2 | 5/2005 | Kouznetsov |
| 6,992,349 B2 | 1/2006 | Lee |
| 7,129,538 B2 | 10/2006 | Lee |

(Continued)

FOREIGN PATENT DOCUMENTS

| | | |
|---|---|---|
| CN | 1401140 A | 3/2003 |
| CN | 106158650 A | 11/2016 |

(Continued)

*Primary Examiner* — David Vu
(74) *Attorney, Agent, or Firm* — SYNCODA LLC; Feng Ma

(57) ABSTRACT

A semiconductor structure and a method for manufacturing a semiconductor structure are provided, which relate to the technical field of semiconductors. The semiconductor structure includes a substrate and a plurality of first conductive layers. The substrate includes a plurality of first trenches extending in a first direction and a plurality of second trenches extending in a second direction. A plurality of active pillars are provided between the plurality of first trenches and the plurality of second trenches. The first direction intersects with the second direction. Each of the plurality of first conductive layers is arranged on each of sidewalls, which are arrayed in the first direction, of a respective one of the plurality of active pillars.

19 Claims, 9 Drawing Sheets

B-B'

(56) References Cited

U.S. PATENT DOCUMENTS

| | | |
|---|---|---|
| 7,615,436 B2 | 11/2009 | Kouznetsov |
| 7,825,455 B2 | 11/2010 | Lee |
| 8,742,493 B2 | 6/2014 | Kim |
| 8,823,076 B2 | 9/2014 | Lee |
| 8,853,765 B2 | 10/2014 | Lee |
| 8,981,457 B2 | 3/2015 | Lee |
| 9,171,857 B2 | 10/2015 | Lee |
| 9,337,201 B2 * | 5/2016 | Heineck ............ H10B 12/48 |
| 9,559,110 B2 | 1/2017 | Lee |
| 10,008,511 B2 | 6/2018 | Lee |
| 10,043,671 B2 | 8/2018 | Xiao |
| 10,644,021 B2 | 5/2020 | Lee |
| 10,720,332 B2 | 7/2020 | Xiao |
| 2002/0028541 A1 | 3/2002 | Lee |
| 2002/0142546 A1 | 10/2002 | Kouznetsov et al. |
| 2004/0206996 A1 | 10/2004 | Lee et al. |
| 2004/0207001 A1 | 10/2004 | Kouznetsov et al. |
| 2004/0214379 A1 | 10/2004 | Lee |
| 2007/0029607 A1 | 2/2007 | Kouznetzov |
| 2009/0173985 A1 | 7/2009 | Lee |
| 2011/0156044 A1 | 6/2011 | Lee |
| 2012/0119286 A1 | 5/2012 | Kim |
| 2012/0223380 A1 | 9/2012 | Lee |
| 2014/0217491 A1 | 8/2014 | Lee et al. |
| 2014/0225180 A1 | 8/2014 | Lee et al. |
| 2015/0044833 A1 | 2/2015 | Lee et al. |
| 2016/0079258 A1 | 3/2016 | Lee |
| 2016/0308043 A1 | 10/2016 | Xiao |
| 2017/0084627 A1 | 3/2017 | Lee |
| 2018/0254286 A1 | 9/2018 | Lee et al. |
| 2018/0330954 A1 | 11/2018 | Xiao |
| 2020/0251492 A1 | 8/2020 | Lee |

FOREIGN PATENT DOCUMENTS

| | | |
|---|---|---|
| CN | 113611671 A | 11/2021 |
| CN | 114121777 A | 3/2022 |

* cited by examiner

B-B'

A-A'

A-A'

A-A'

A-A'

A-A'

A-A'

B-B'

B-B'

B-B'

B-B'

SEMICONDUCTOR STRUCTURE AND METHOD FOR MANUFACTURING SEMICONDUCTOR STRUCTURE

CROSS-REFERENCE TO RELATED APPLICATIONS

This is a continuation application of International Patent Application No. PCT/CN2022/104041, filed on Jul. 6, 2022, which claims priority to Chinese Patent Application No. 202210018352.4, filed on Jan. 7, 2022 and entitled "SEMICONDUCTOR STRUCTURE AND METHOD FOR MANUFACTURING SEMICONDUCTOR STRUCTURE". The disclosures of International Patent Application No. PCT/CN2022/104041 and Chinese Patent Application No. 202210018352.4 are incorporated by reference herein in their entireties.

BACKGROUND

A Dynamic Random Access Memory (DRAM) is a semiconductor memory for writing and reading data randomly at high speed, which is widely used in data storage devices or apparatuses.

The DRAM generally includes a plurality of repeated memory cells, and each memory cell includes a transistor and a capacitor. A source or a drain of the transistor is connected to the capacitor through a capacitor contact to write data information into the capacitor or read data information from the capacitor. However, the contact resistance between the source or the drain of the transistor and the capacitor contact is relatively large, which degrades the performance of the semiconductor structure.

SUMMARY

The disclosure relates to the technical field of semiconductors, and in particular to a semiconductor structure and a method for manufacturing a semiconductor structure.

Embodiments of the disclosure provide a semiconductor structure and a method for manufacturing a semiconductor structure, so as to reduce the contact resistance between a transistor and a capacitor contact, thereby improving the performance of the semiconductor structure.

In order to achieve the purpose, the embodiments of the disclosure provide the following technical solutions.

A first aspect of the embodiments of the disclosure provides a semiconductor structure, which includes:
  a substrate, in which the substrate includes a plurality of first trenches extending in a first direction and a plurality of second trenches extending in a second direction, a plurality of active pillars are provided between the plurality of first trenches and the plurality of second trenches, and the first direction intersects with the second direction; and
  a plurality of first conductive layers, in which each of the plurality of first conductive layers is arranged on each of sidewalls, which are arrayed in the first direction, of a respective one of the plurality of active pillars.

A second aspect of the embodiments of the disclosure provides a method for manufacturing a semiconductor structure, which includes the following operations.

A substrate is provided.

A plurality of first trenches extending in a first direction and a plurality of second trenches extending in a second direction are formed in the substrate, in which a plurality of active pillars are provided between the plurality of first trenches and the plurality of second trenches, and the first direction intersects with the second direction.

A first conductive layer is formed on each of sidewalls, which are arrayed in the first direction, of each of the plurality of active pillars.

In addition to the technical problems solved by the embodiments of the disclosure described above, the technical features constituting the technical solutions, and the beneficial effects brought by the technical features of these technical solutions, other technical problems to be solved by the semiconductor structure and the method for manufacturing the semiconductor structure provided in the embodiments of the disclosure, other technical features included in the technical solutions, and other beneficial effects brought by these technical features will be further described in detail in the detail description.

BRIEF DESCRIPTION OF THE DRAWINGS

In order to describe the technical solutions in the embodiments of the disclosure or in the related art more clearly, the accompanying drawings required to be used in descriptions about the embodiments of the disclosure or the related art will be simply introduced below. Apparently, the accompanying drawings described below show merely some embodiments of the disclosure, and persons of ordinary skill in the art may still derive other drawings from these accompanying drawings without creative effort.

REFERENCE NUMERALS

10: Substrate; 11: First trench; 12: Second trench; 13: Active pillar;
20: First conductive layer; 21: First initial conductive layer;
30: First isolation layer; 31: Void; 32: First sub isolation layer; 33: Second sub isolation layer; 34: Insulation layer;
40: Bit line structure;
50: First dielectric layer; 51: First initial dielectric layer;
60: Second conductive layer;
70: Second isolation layer;
80: Third isolation layer; 81: Third initial isolation layer; 82: Third trench; 83: Fourth trench.

DETAILED DESCRIPTION

In the embodiments of the disclosure, the first conductive layer is provided on each of the sidewalls, which are arrayed in the first direction, of the respective one of the plurality of active pillars, so as to increase the size of the active pillar in the first direction, so that the purpose of increasing the area of the active pillar is achieved, and the contact resistance with the capacitor contact subsequently formed on the active pillar is reduced, thereby improving the performance of the semiconductor structure.

In order to make the foregoing objectives, features and advantages of the embodiments of the disclosure more apparent and lucid, the technical solutions in the embodiments of the disclosure are clearly and completely described below with reference to the accompanying drawings in the embodiments of the disclosure. It is apparent that the embodiments described here are merely some rather than all of the embodiments of the disclosure. All other embodiments obtained by a person of ordinary skill in the art based on the embodiments of the disclosure without creative efforts shall fall within the protection scope of the disclosure.

In this embodiment, a semiconductor structure is not limited. The following description will be made by taking the semiconductor structure as a DRAM as an example. However, this embodiment is not limited thereto, and the semiconductor structure in this embodiment may also be other structures. The semiconductor structure and a method for manufacturing a semiconductor structure will be described in detail below with reference to FIG. 1 to FIG. 18.

Figure 1:
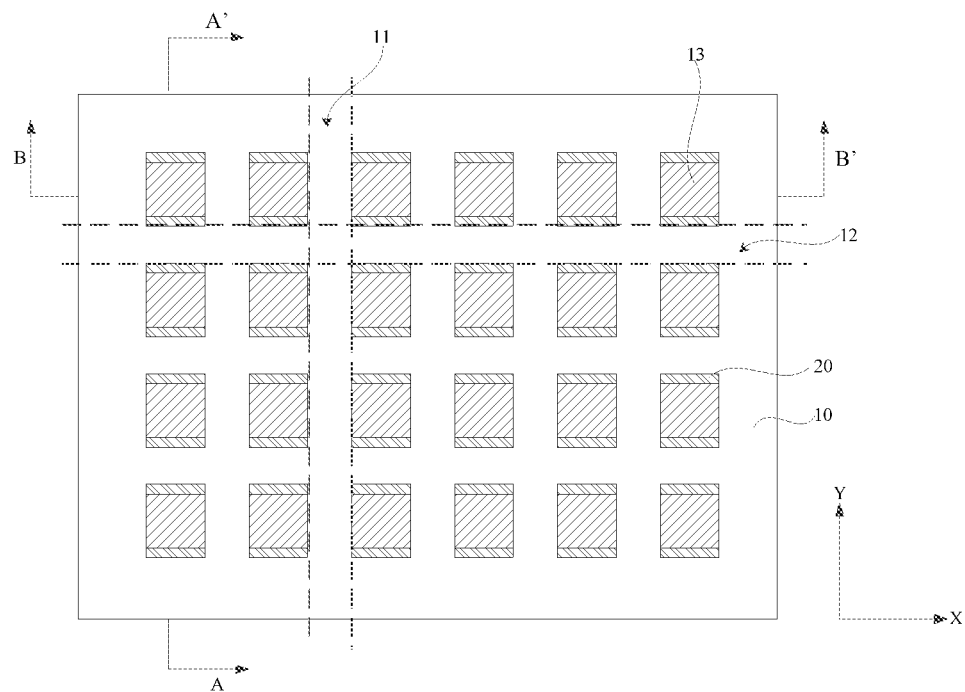
FIG. 1 is a top view of a semiconductor structure according to an embodiment of the disclosure.
Figure 2:
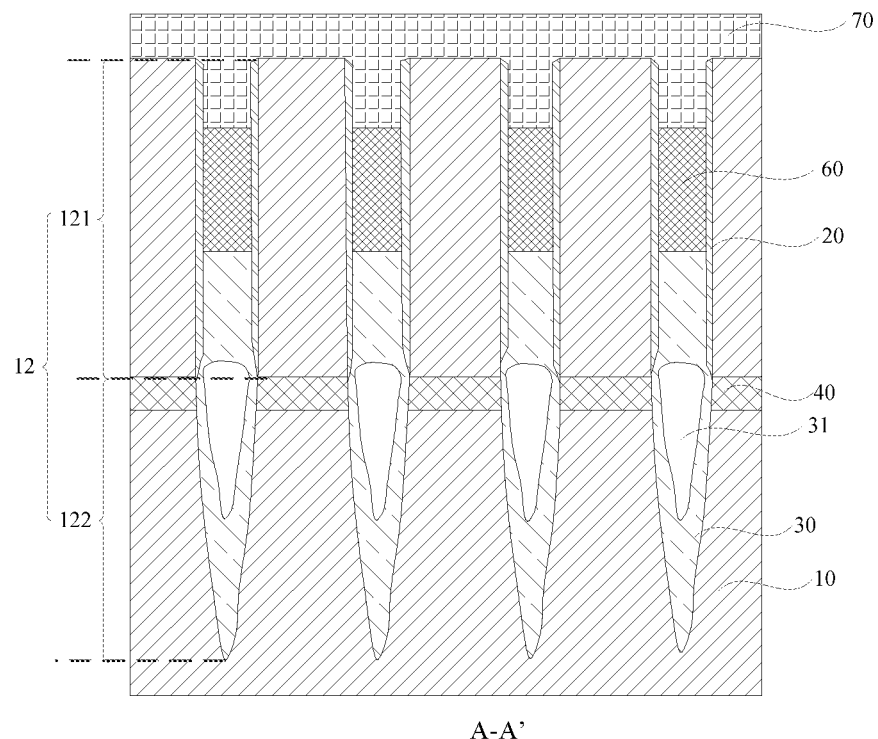
FIG. 2 is a cross-sectional view taken along the A-A' direction in FIG. 1.
Figure 3:
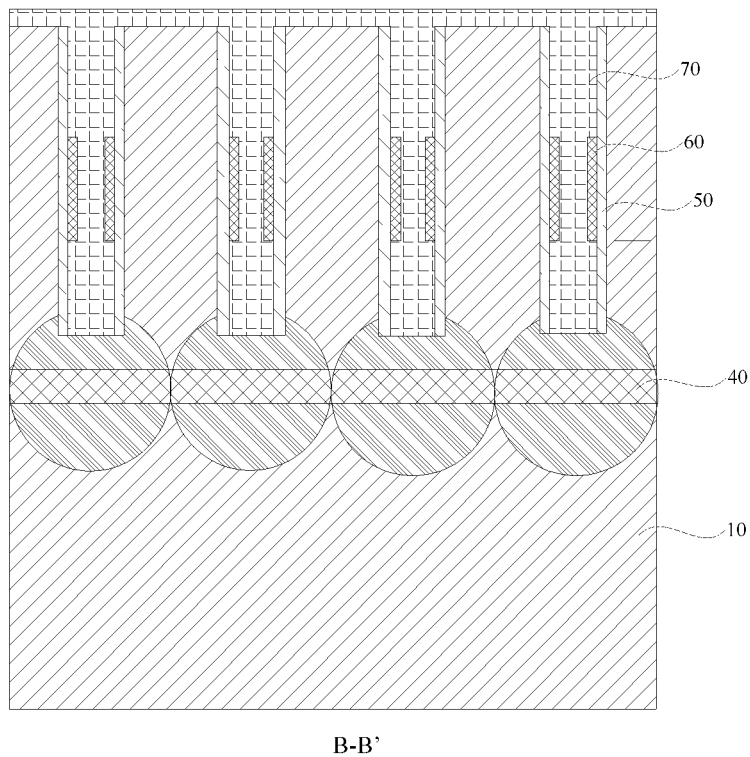
FIG. 3 is a cross-sectional view taken along the B-B' direction in FIG. 1.

As shown in FIG. 1 to FIG. 3, the semiconductor structure provided by the embodiments of the disclosure includes a substrate 10 and a plurality of first conductive layers 20.

The substrate 10 may be made of a semiconductor material. The semiconductor material may be one or more of silicon, germanium, a silicon germanium compound, or a silicon carbon compound.

As shown in FIG. 1, the substrate 10 includes a plurality of first trenches 11 extending in a first direction and a plurality of second trenches 12 extending in a second direction. A plurality of active pillars 13 are provided between the plurality of first trenches 11 and the plurality of second trenches 12. The first direction intersects with the second direction.

It should be noted that the first direction is the Y direction shown in FIG. 1, and the second direction is the X direction shown in FIG. 1.

The plurality of first trenches 11 are spaced apart from each other in the second direction, and the plurality of second trenches 12 are spaced apart from each other in the first direction, so as to divide the substrate 10 into the plurality of active pillars 13 spaced apart from each other. In this embodiment, the first trench 11 can be understood as an area between two lateral dotted lines as shown in FIG. 1, and the second trench 12 can be understood as an area between two longitudinal dotted lines as shown in FIG. 1.

A depth of the first trench 11 may be the same as or different from a depth of the second trench 12. Exemplarily, the depth of the first trench 11 is less than the depth of the second trench 12.

With reference to FIG. 1 and FIG. 2, each of the plurality of first conductive layers 20 is arranged on each of sidewalls, which are arrayed in the first direction, of a respective one of the plurality of active pillars 13. That is, each first conductive layer 20 is arranged on each of sidewalls, which face the second trenches 12, of a respective one of the plurality of active pillars 13. Taking the orientation shown in FIG. 1 as an example, the first conductive layers 20 are respectively arranged on a front sidewall and a rear sidewall of each active pillar 13. A material of the first conductive layer 20 includes polycrystalline silicon.

In this embodiment, the first conductive layer 20 is arranged on each of the sidewalls, which face the second trenches 12, of a respective one the plurality of active pillars 13, so as to increase the width of the active pillar in the first direction, so that the cross-sectional area of the top portion of the active pillar 13 can be increased. In this way, the contact area with the capacitor contact subsequently formed on top surface of the active pillar 13 is reduced, so that the contact resistance between the active pillar 13 and the capacitor contact is reduced, thereby improving the performance of the semiconductor structure.

In addition, the first conductive layer 20 is arranged on each of sidewalls, which are arrayed in the first direction, of a respective one of the plurality of first active pillars 13. That is, there is a gap between the bottom surface of the first conductive layer 20 facing the substrate 10 and the bottom surface of the second trench 12, so that a subsequently formed bit line structure can be prevented from being electrically connected to the top portion of the active pillar 13, thereby improving the yield of the semiconductor structure.

In some embodiments, with reference to FIG. 2, each of the plurality of second trenches 12 includes a first isolation layer 30 and a void 31. That is, the first isolation layer 30 is arranged in the second trench 12, and the void 31 is arranged in the first isolation layer 30, so that the dielectric constant of the first isolation layer 30 can be reduced, and the parasitic capacitance between adjacent bit line structures 40 can be further reduced, thereby improving the performance of the semiconductor structure.

In this embodiment, the shape of the void 31 may be regular or irregular, which is influenced by the shape of the second trench 12 and the process of forming the first isolation layer 30. In addition, there may be one or more voids 31 in the same second trench 12, which is not specifically limited in this embodiment.

Exemplarily, taking the orientation shown in FIG. 2 as an example, and taking a section perpendicular to the substrate 10 as a longitudinal section, the shape of the longitudinal section of the second sub-trench 122 may be a droplet shape, which may facilitate the formation of the void 31, thereby reducing the parasitic capacitance between the adjacent bit line structures 40, while avoiding the electrical connection between the adjacent bit line structures 40.

In addition, the top surface of the first isolation layer 30 is lower than the top surface of the active pillar 13, so that a space is formed between the top surface of the first isolation layer 30 and the top surface of the active pillar 13, which facilitates the formation of a word line structure in this space.

In some embodiments, the void 31 may be arranged below the first conductive layer 20, or may be arranged between the first conductive layers 20. In a case that the void 31 is arranged below the first conductive layer 20, it can be understood that the void 31 is formed in a portion of the first isolation layer 30 between the bottom portion of the first conductive layer 20 and the bottom portion of the second trench 12, and at least a portion of the void 31 is arranged between the adjacent bit line structures 40, so as to ensure that the parasitic capacitance between the adjacent bit line structures 40 can be reduced.

Correspondingly, in a case that the void 31 is arranged between the first conductive layers 20, it can be understood that the void 31 is formed in a portion of the first isolation layer 30 between the bottom portion of the first conductive layer 20 and the top portion of the first conductive layer 20, and at least a portion of the void 31 is arranged between the adjacent bit line structures 40, so as to ensure that the parasitic capacitance between the adjacent bit line structures 40 can be reduced.

In some embodiments, with reference to FIG. 2, each of the plurality of second trenches 12 includes a first sub-trench 121 and a second sub-trench 122. The first sub-trench 121 is arranged above the second sub-trench 122, and communicates with the second sub-trench 122.

Taking the orientation shown in FIG. 2 as an example, from top to bottom, the area arranged in the second trench 12 between the first dotted line and the second dotted line is the first sub-trench 121, and the area arranged in the second trench 12 between the second dotted line and the third dotted line is the second sub-trench 122.

A cross-sectional area of the first sub-trench 121 is greater than or equal to a cross-sectional area of the second sub-trench 122. In this embodiment, the cross-sectional area refers to the cross-sectional area in the direction parallel to the substrate 10.

In this embodiment, the second trench 12 has a structure with a large top portion and a small bottom portion. In this way, when the first isolation layer 30 is subsequently formed in the second trench 12, under the influence of the cross-sectional areas of the first sub-trench 121 and the second sub-trench 122, the smaller the cross-sectional area is, the more easily the void 31 is formed in the first isolation layer 30.

Taking the section perpendicular to the substrate 10 as the longitudinal section, the shape of the longitudinal section of the first sub-trench 121 may be rectangular, and the shape of the longitudinal section of the second sub-trench 122 can be regular or irregular. Exemplarily, a width of the second sub-trench 122 is gradually reduced from the end close to the first sub-trench 121 to the end away from the first sub-trench 121. Taking the orientation shown in FIG. 2 as an example, the width of the second sub-trench 122 is gradually reduced from top to bottom, so that the second sub-trench 122 has a structure with a large top portion and a small bottom portion. For example, the shape of the longitudinal section of the second sub-trench 122 is V shape, so that the closer to the bottom portion of the substrate 10 is, the less the width of the second sub-trench 122 is, and the more easily the void 31 is formed in the second sub-trench 122, thereby reducing the dielectric constant of the first isolation layer 30 arranged in the second sub-trench 122.

It should be noted that the shape of the longitudinal section of the second sub-trench 122 is not limited to the above-mentioned V shape, and the section of the second sub-trench 122 may also be a trapezoidal structure with a large top portion and a small bottom portion, so that a void 31 may also be formed in the second trench 12.

In some embodiments, each of the plurality of first conductive layers 20 is arranged on a sidewall, which is arranged in the first sub-trench 121, of a respective one of the plurality of active pillars 13. In a direction perpendicular to the substrate 10, the active pillar 13 includes a channel area, a source area arranged on one side of the channel area, and a drain area arranged on the other side of the channel area. The drain area is arranged at the bottom portion of the active pillar 13 and is configured for being connected to the bit line structure. The channel area is arranged in the middle portion of the active pillar 13 and is configured for being connected to the word line. The source area is arranged on the top portion of the active pillar 13 and is configured for being connected to the capacitor contact, so as to achieve the electrical connection between the capacitor and the source area.

Based on this, in this embodiment, the first conductive layer 20 is arranged on the sidewall, which is arranged in the first sub-trench 121, of the active pillar 13. In this way, on the one hand, the area of the source area of the active pillar 13 can be increased, and on the other hand, the manufacturing cost of the first conductive layer 20 can be reduced compared with the technical solution in which all the first conductive layers 20 are arranged on the sidewalls, which are arranged in the second trenches 12, of the active pillars 13.

In some embodiments, with reference to FIG. 2 and FIG. 3, a bit line structure 40 is provided below a bottom portion of each of the plurality of first trenches 11. The bit line structure 40 extends in the first direction.

The bit line structure 40 is configured for being connected to the drain of the active pillar 13, so that the data in the capacitor is read or the data is written into the capacitor through the bit line structure 40. A material of the bit line structure 40 can include cobalt silicide or silicon germanium.

In some embodiments, as shown in FIG. 3, a first dielectric layer 50 and a second conductive layer 60 are provided on a sidewall, which is arranged in a respective one of the plurality of first trenches 11, of each of the plurality of active pillars 13. The first dielectric layer 50 and the second conductive layer 60 are stacked on one another on the sidewall, which is arranged in the first trench 11, of the active pillar 13, and the first dielectric layer 50 is connected to the sidewall, which is arranged in the first trench 11, of the active pillar 13. The first dielectric layer 50 is configured as a gate oxide layer of a transistor subsequently formed, and a material of the first dielectric layer can be silicon oxide or other materials with high dielectric constant.

In the section taken along the second direction, the second conductive layer 60 is arranged on the first dielectric layer 50, and the projection of the second conductive layer 60 on the active pillar 13 at least covers the channel area of the active pillar 13. In the section taken along the first direction, the second conductive layer 60 is arranged above the first isolation layer 30 of the second trench 12, and the top surface of the second conductive layer 60 is lower than the top surface of the active pillar 13, so that the second conductive layer 60 forms a word line extending in the second direction. The word line is configured for connecting all the active pillars arrayed in the same second direction, so that a voltage is applied to the channel area of the active pillar 13 through the word line to control connection or disconnection between the source area and the drain area of the active pillar 13. A material of the second conductive layer 60 may include metal tungsten.

In some embodiments, the semiconductor structure includes a second isolation layer 70. As shown in FIG. 2, in the section taken along the first direction, the second isolation layer 70 is arranged above the second conductive layer 60 and arranged in a respective one of the plurality of second trenches 12. As shown in FIG. 3, in the section taken along the second direction, the second isolation layer 70 is arranged between sidewalls, which are arranged in a respective one of the plurality of first trenches 11, of two adjacent active pillars 13 of the plurality of active pillars. In this way, any two adjacent second conductive layers 60 can be insulated from each other. The second isolation layer 70 can include an insulating material, such as silicon oxide or silicon nitride.

Figure 4:
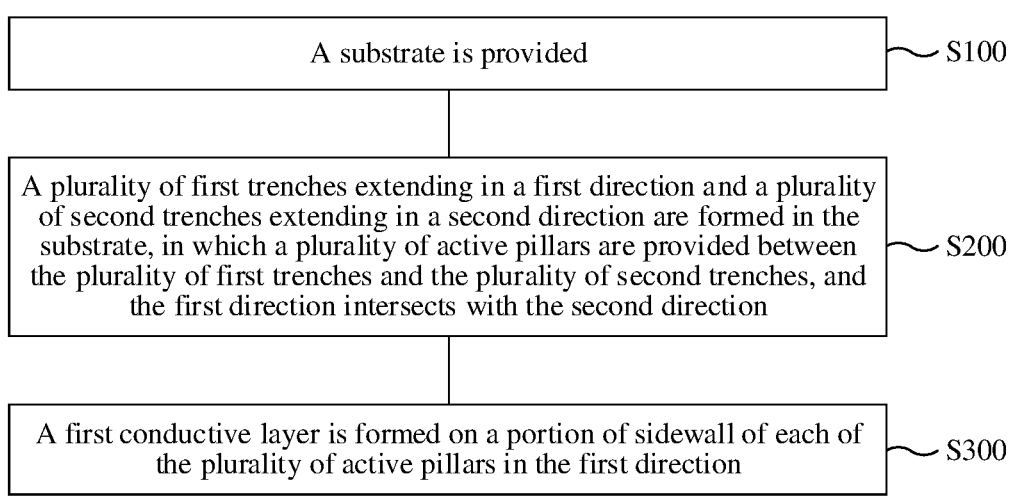
FIG. 4 is a flowchart of a method for manufacturing a semiconductor structure according to an embodiment of the disclosure.

As shown in FIG. 4, an embodiment of the disclosure further provides a method for manufacturing a semiconductor structure, which includes the following operations.

In S100, a substrate is provided.

The substrate 10 may be made of a semiconductor material. The semiconductor material may be one or more of silicon, germanium, a silicon germanium compound, or a silicon carbon compound.

Figure 5:
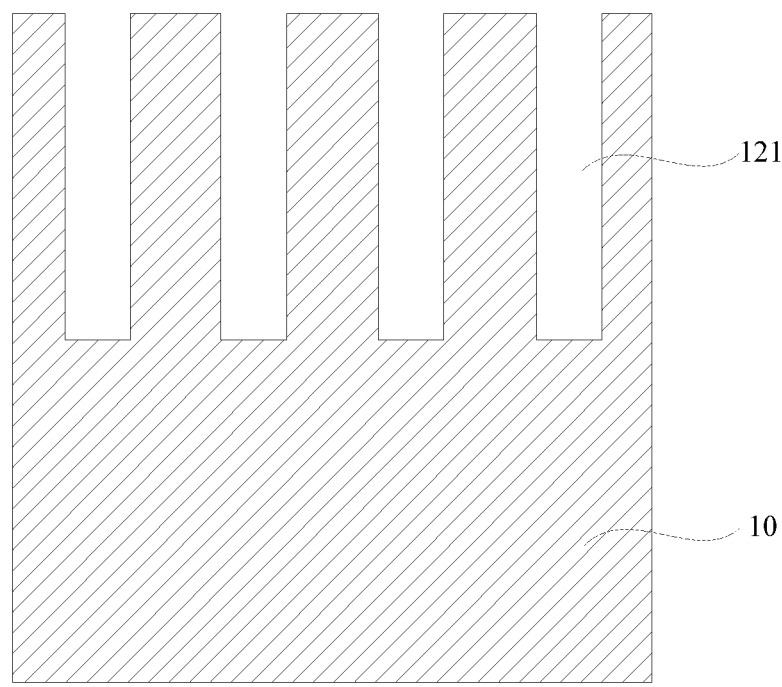
FIG. 5 is a schematic cross-sectional view of a structure taken along the A-A' direction after forming a first sub-trench in a method for manufacturing a semiconductor structure according to an embodiment of the disclosure.
Figure 15:
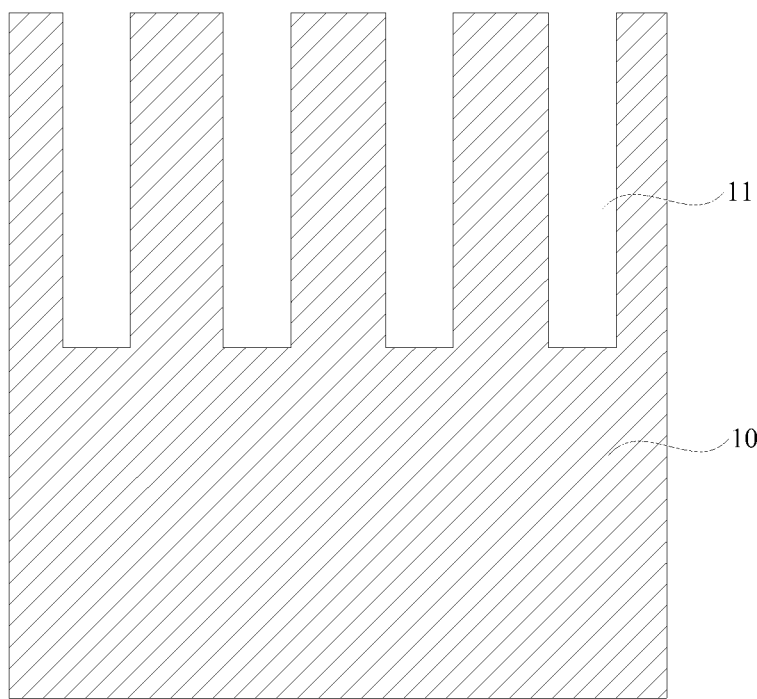
FIG. 15 is a schematic cross-sectional view of a structure taken along the B-B' direction after forming a first trench in a method for manufacturing a semiconductor structure according to an embodiment of the disclosure.

In S200, a plurality of first trenches extending in a first direction and a plurality of second trenches extending in a second direction are formed in the substrate, in which a plurality of active pillars are provided between the plurality of first trenches and the plurality of second trenches, and the first direction intersects with the second direction intersect. The structure formed in this operation is shown in FIG. 5 and FIG. 15.

It should be noted that in this embodiment, the forming sequence of the first trenches 11 and the second trenches 12 is not limited. The process of forming the first trenches 11 and the second trenches 12 may be performed in such a way that one of the first trenches 11 and the second trenches 12 is firstly etched, and then the other one of the first trenches 11 and the second trenches 12 is etched; or may also be any other process capable of forming the first trenches 11 and the second trenches 12.

For ease of description, in this embodiment, the process of manufacturing the semiconductor structure is described by taking the process in which the second trenches 12 are firstly formed as an example.

Exemplarily, a first photoresist layer can be formed on the substrate 10 through a coating process, and then the first photoresist layer is patterned through an exposure, development or etching process to form a first mask pattern in the first photoresist layer. The first mask pattern includes a plurality of first mask protrusions and first mask openings arranged between any two adjacent first mask protrusions. The plurality of first mask protrusions are spaced apart from each other in the first direction, and each first mask protrusion extends in the second direction. The first direction is perpendicular to the second direction.

As shown in FIG. 5, after the first mask openings are formed, a portion of a thickness of the substrate 10 exposed in the first mask openings may be removed by using an etching liquid or an etching gas, so as to form a plurality of first sub-trenches 121 in the substrate 10. The plurality of first sub-trenches 121 are spaced apart from each other in the first direction, and each first sub-trench 121 extends in the second direction.

Figure 6:
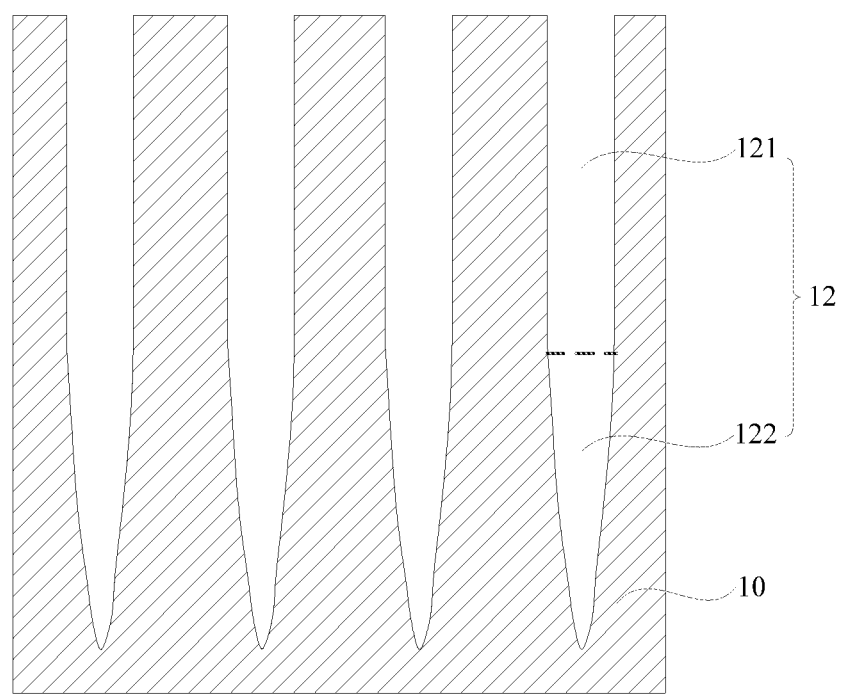
FIG. 6 is a schematic cross-sectional view of a structure taken along the A-A' direction after forming a second sub-trench in a method for manufacturing a semiconductor structure according to an embodiment of the disclosure.

As shown in FIG. 6, after the first sub-trenches 121 are formed, the first sub-trenches 121 are continuously etched to form the second sub-trenches 122 at the bottom portions of the first sub-trenches 121. That is, a portion of the substrate 10 exposed at the bottom portions of the first sub-trenches 121 is removed in the vertical direction to form the second sub-trenches 122. The second sub-trench 122 communicates with the first sub-trench 121, so that the second trenches 12 are formed. The first sub-trench 121 is the area between the dotted line in FIG. 6 and the top portion of the second trench 12, and the second sub-trench 122 is the area between the dotted line in FIG. 6 and the bottom portion of the second trench 12.

The cross-sectional area of the first sub-trench 121 is greater than or equal to the cross-sectional area of the second sub-trench 122, so that the second trench 12 has a structure with a large top portion and a small bottom portion. In this way, when the first isolation layer 30 is subsequently formed in the second trench 12, under the influence of the cross-sectional areas of the first sub-trench 121 and the second sub-trench 122, the smaller the cross-sectional area is, the more easily the void 31 is formed in the first isolation layer 30.

In S300, a first conductive layer is formed on each of sidewalls, which are arrayed in the first direction, of each of the plurality of active pillars.

Figure 7:
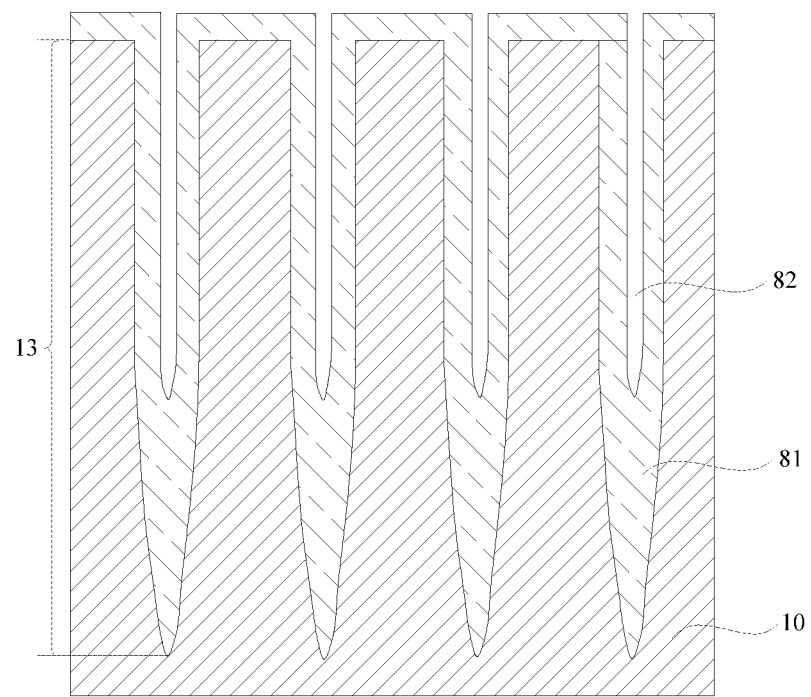
FIG. 7 is a schematic cross-sectional view of a structure taken along the A-A' direction after forming a third initial isolation layer in a method for manufacturing a semiconductor structure according to an embodiment of the disclosure.

As shown in FIG. 7, in the section taken along the first direction, a third initial isolation layer 81 is formed in the plurality of second trenches 12. For example, the third initial isolation layer 81 may be formed in the second trenches 12 through an atomic layer deposition process. The third initial isolation layer 81 defines a third trench 82 in each second trench 12, and the third initial isolation layer 81 also covers the top surface of the substrate 10.

Figure 8:
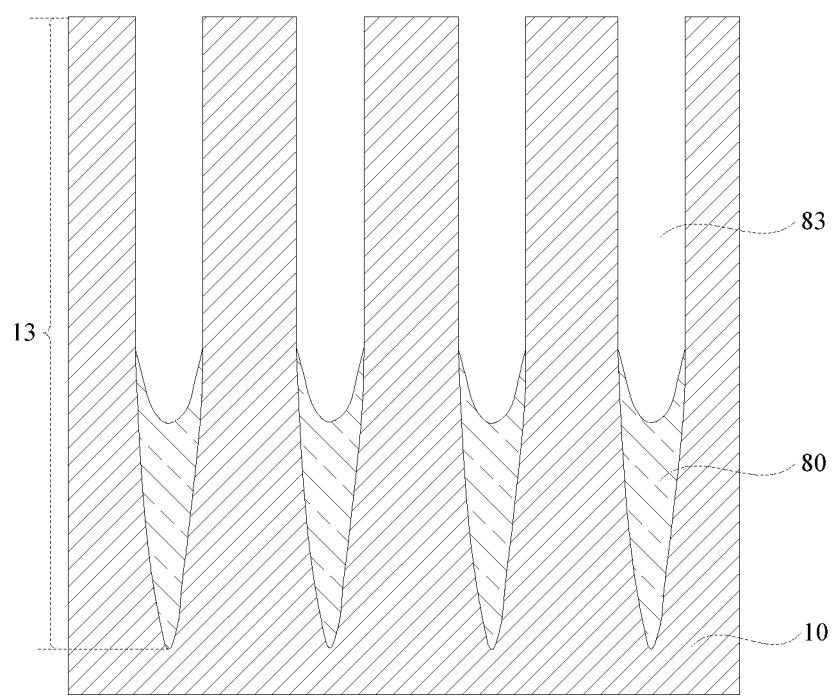
FIG. 8 is a schematic cross-sectional view of a structure taken along the A-A' direction after forming a third isolation layer in a method for manufacturing a semiconductor structure according to an embodiment of the disclosure.

As shown in FIG. 8, the third trench 82 may be etched to remove the third initial isolation layer 81 arranged on the top surface of the substrate 10 and in a portion of each second trench 12, so that the remaining portion of the third initial isolation layer 81 forms a third isolation layer 80 arranged at the bottom portion of each second trench 12. The third isolation layer 80 and the second trench define a fourth trench 83.

In this embodiment, a material of the third isolation layer 80 includes silicon oxide. The third isolation layer 80 is formed at the bottom portion of each second trench 12, so that it can be ensured that the first conductive layer 20 is only formed on the upper portion of each second trench 12, that is, it can be ensured that the first conductive layer 20 covers at least a portion of the sidewall of each first sub-trench 121.

Figure 9:
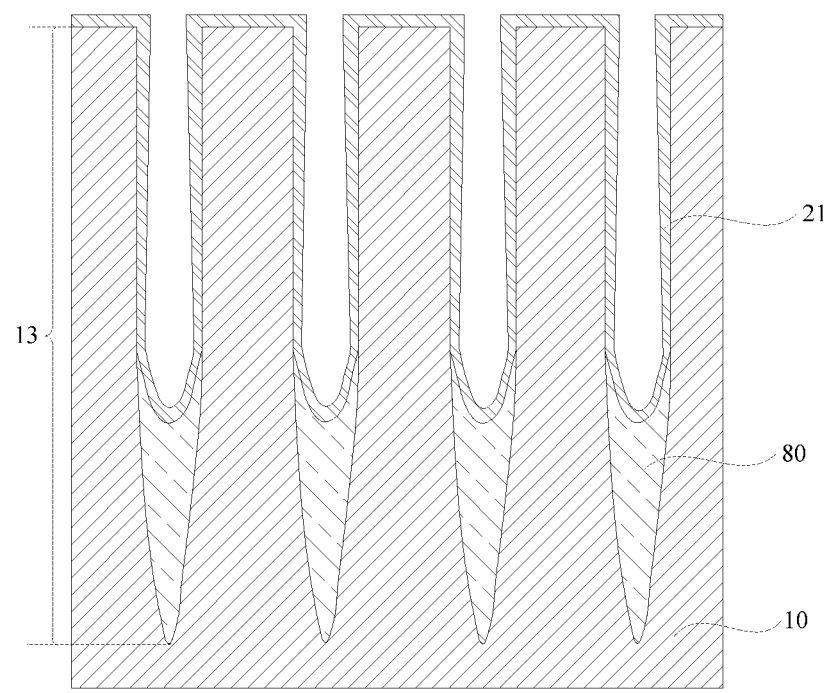
FIG. 9 is a schematic cross-sectional view of a structure taken along the A-A' direction after forming a first initial conductive layer in a method for manufacturing a semiconductor structure according to an embodiment of the disclosure.

As shown in FIG. 9, a first initial conductive layer 21 is formed in the fourth trenches 83 and on the substrate 10 through a deposition process. That is, the first initial conductive layer 21 is formed on a portion of the sidewall of each second trench 12 and on the top surface of the third isolation layer 80. The first initial conductive layer 21 extends out of the second trenches 12 and covers the top surface of the substrate 10.

The deposition process may include any one of a Chemical Vapor Deposition (CVD) process, a Low Pressure CVD (LPCVD) process, a Plasma Enhanced CVD (PECVD) process, an Atomic Layer Deposition (ALD) process, or a Plasma Enhanced ALD (PEALD) process.

Figure 10:
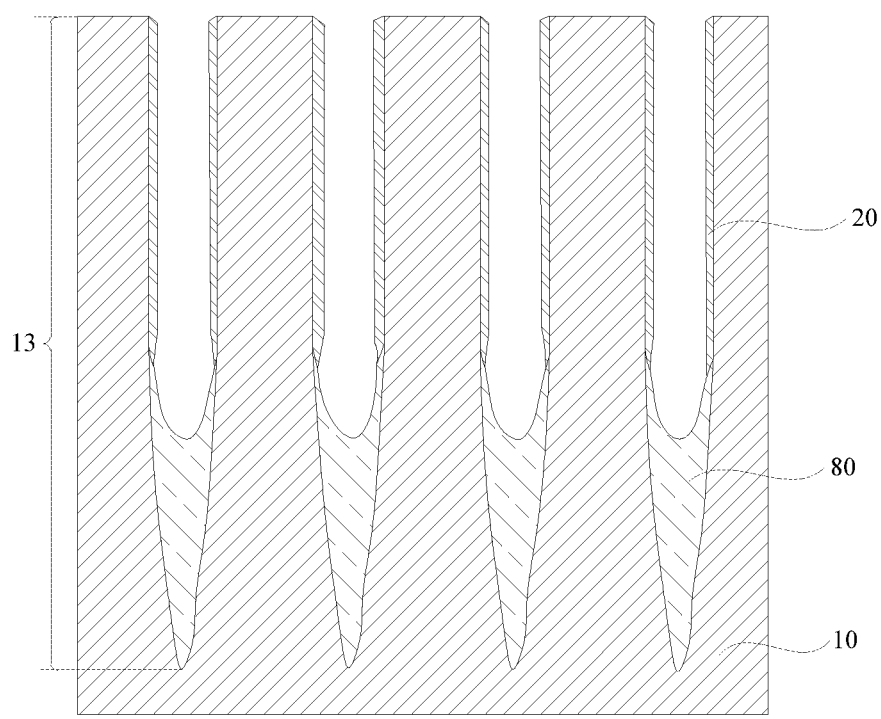
FIG. 10 is a schematic cross-sectional view of a structure taken along the A-A' direction after forming a first conductive layer in a method for manufacturing a semiconductor structure according to an embodiment of the disclosure.

As shown in FIG. 10, the first initial conductive layer 21 on the top surface of the third isolation layer 80 and the first initial conductive layer 21 on the top surface of the substrate 10 are removed by using an etching gas or an etching liquid, so that the first initial conductive layer 21 arranged on a sidewall, which is arranged in a respective one of the plurality of second trenches 12, of each of the plurality of active pillars 13 is remained to form the first conductive layer 20. In other words, the first initial conductive layer 21 arranged on the sidewall of each fourth trench 83 is remained to form the first conductive layer 20.

In this embodiment, a portion of the first initial conductive layer 21 arranged on an inner wall of each first sub-trench 121 may be remained, or all of the first initial conductive layer 21 arranged on an inner wall of each first sub-trench 121 may be remained. A material of first conductive layer 20 includes polycrystalline silicon.

Figure 11:
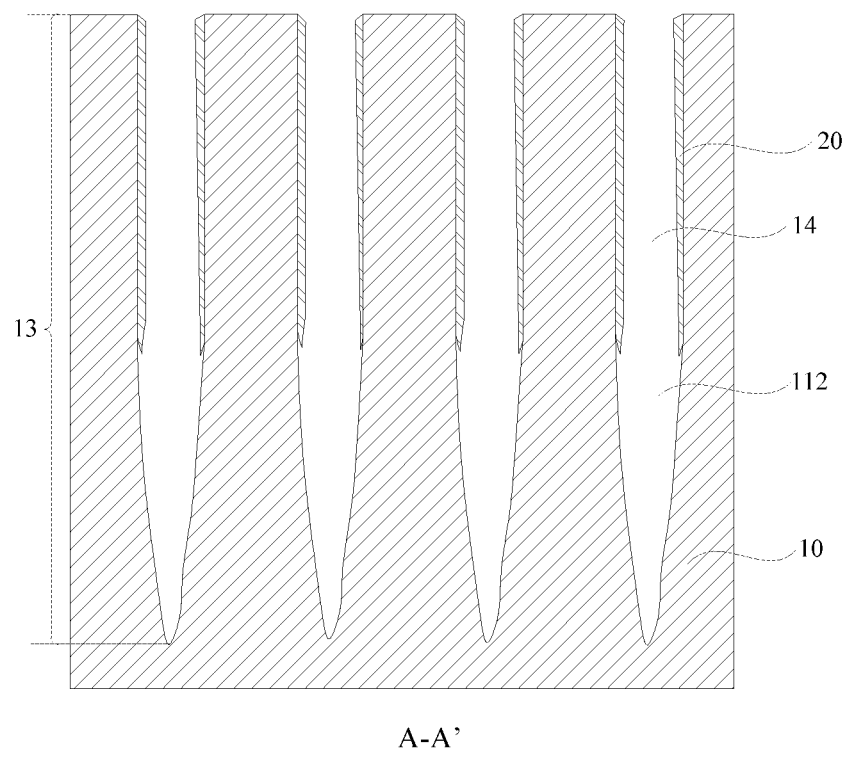
FIG. 11 is a schematic cross-sectional view of a structure taken along the A-A' direction after removing a third isolation layer in a method for manufacturing a semiconductor structure according to an embodiment of the disclosure.

After the first conductive layer 20 is formed, as shown in FIG. 11, the third isolation layer 80 is removed.

In this embodiment, the first conductive layer 20 is formed on a sidewall, which is arranged in a respective one of the plurality of second trenches 12, of each of the plurality of active pillars 13, so that the cross-sectional area on the top portion of the active pillar 13 can be increased, the contact area between the active pillar and the capacitor contact can be increased, and the contact resistance between the active pillar and the capacitor contact can be reduced, thereby improving the performance of the semiconductor structure.

In some embodiments, after the first conductive layer is formed, a first isolation layer 30 and a void 31 are formed in each of the plurality of second trenches 12. The first isolation layer 30 includes a first sub isolation layer 32 and a second sub isolation layer 33.

Figure 12:
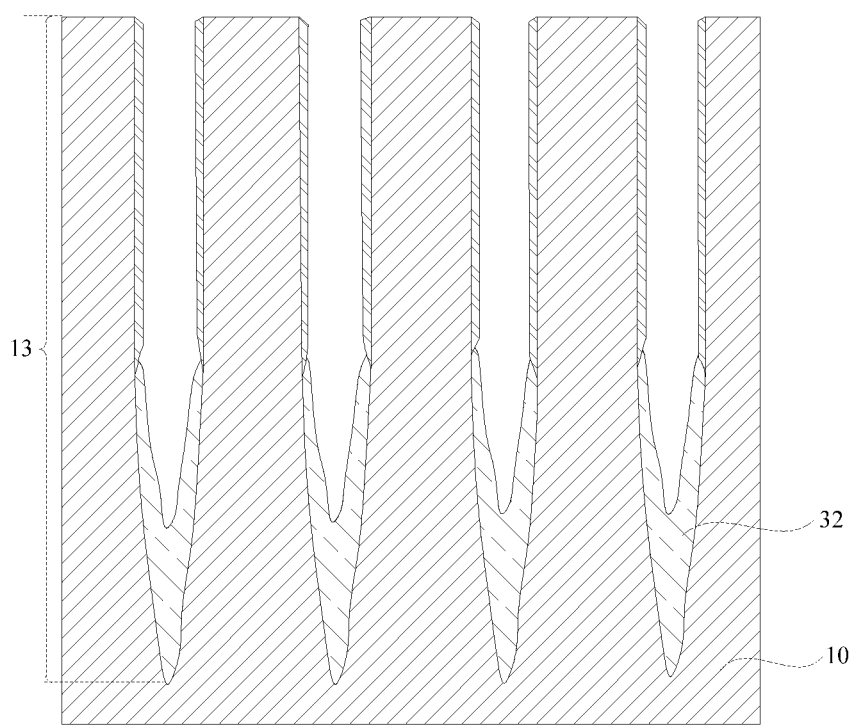
FIG. 12 is a schematic cross-sectional view of a structure taken along the A-A' direction after forming a first sub isolation layer in a method for manufacturing a semiconductor structure according to an embodiment of the disclosure.

Exemplarily, the first isolation layer 30 is manufactured in two operations. As shown in FIG. 12, the first sub isolation layer 32 is firstly formed in the second sub-trench 122 through a thermal oxidation process, in which the second sub-trench 122 is not completely filled with the first sub isolation layer 32.

Figure 13:
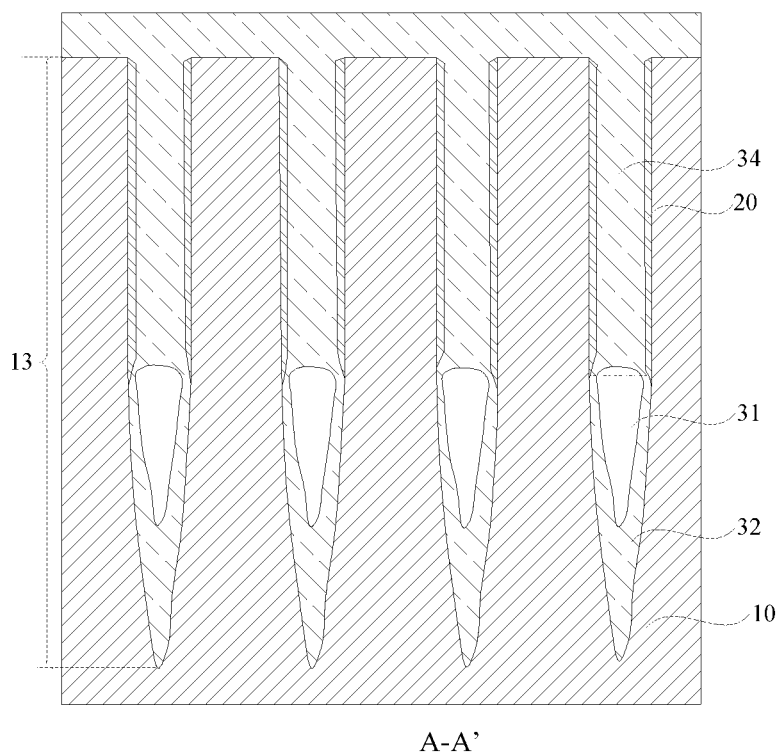
FIG. 13 is a schematic cross-sectional view of a structure taken along the A-A' direction after forming an insulation layer in a method for manufacturing a semiconductor structure according to an embodiment of the disclosure.

Next, as shown in FIG. 13, an insulation material with poor filling capability is deposited in the first sub-trenches 121 to form an insulation layer 34. The insulation layer 34 extends out of the first sub-trenches 121 and covers the top surface of the substrate 10. In this embodiment, the area defined by the first sub isolation layer 32 and the first conductive layer 20 is not completely filled with the insulation layer 34, so that the insulation layer 34 and the first sub isolation layer 32 define a void 31 in the second trench 12.

Figure 14:
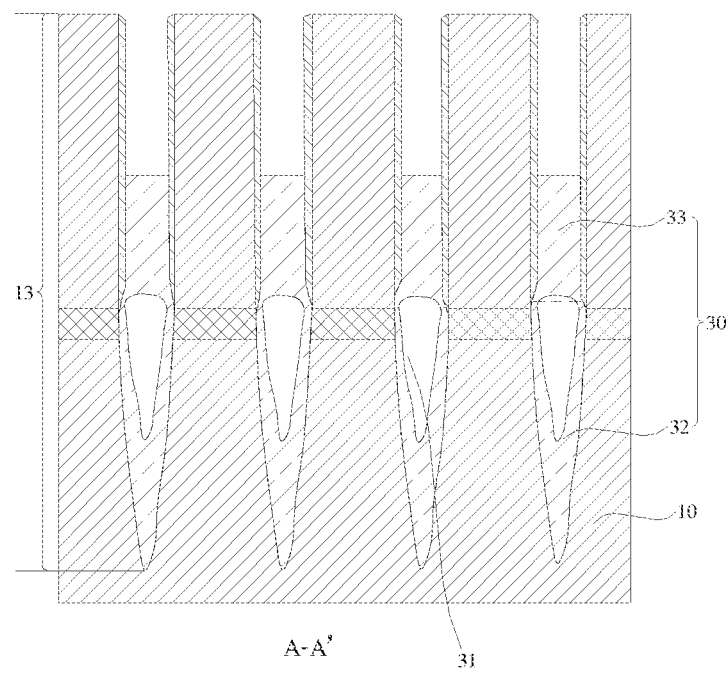
FIG. 14 is a schematic cross-sectional view of a structure taken along the A-A' direction after forming a second sub isolation layer in a method for manufacturing a semiconductor structure according to an embodiment of the disclosure.

Next, as shown in FIG. 14, a portion of a thickness of the insulation layer 34 is removed to expose a portion of the second trench 12, so that a remaining portion of the insulation layer 34 forms the second sub isolation layer 33. The second sub isolation layer 33 is connected to the first sub isolation layer 32 to form the first isolation layer 30.

In this embodiment, the void 31 is formed in the second trench 12. In this way, on the one hand, the dielectric constant of the first isolation layer 30 can be reduced, on the other hand, the insulating property of the first isolation layer 30 can be increased, so that when the bit line structures are subsequently formed in the substrate, the parasitic capacitance between the adjacent bit line structures can be reduced, while avoiding the electrical connection between the adjacent bit line structures.

In some embodiments, after the first isolation layer 30 is formed, the substrate 10 may be patterned again to form a plurality of first trenches 11 in the substrate 10. The structures of the plurality of first trenches are shown in FIG. 15. A depth of the first trench 11 is less than a depth of the second trench 12, and the substrate is divided into a plurality of initial active pillars by the plurality of first trenches 11 and the plurality of second trenches 12. And then each initial active pillar is ion doped through an ion implantation process to form the active pillar 13.

Exemplarily, firstly, the ion implantation energy and the type of implanted doping ions in the ion implantation process can be controlled to form a drain area at the bottom portion of the initial active pillar. Then, the ion implantation energy and the type of implanted doping ions in the ion implantation process can be controlled to form a channel area in the middle portion of the initial active pillar. Finally, the ion implantation energy and the type of implanted doping ions in the ion implantation process can be controlled to form a drain area on the top portion of the initial active pillar. The type of the doping ions in the drain area can be the same as the type of the doping ions in the source area. For example, the doping ions can include N-type ions. The type of the doping ions in the channel area is different from the type of the doping ions in the drain area. For example, the doping ions may include P-type ions.

It should be noted that the process of forming the first trench 11 may be the same as the forming process of the second trench 12, which is not repeated in this embodiment.

Figure 16:
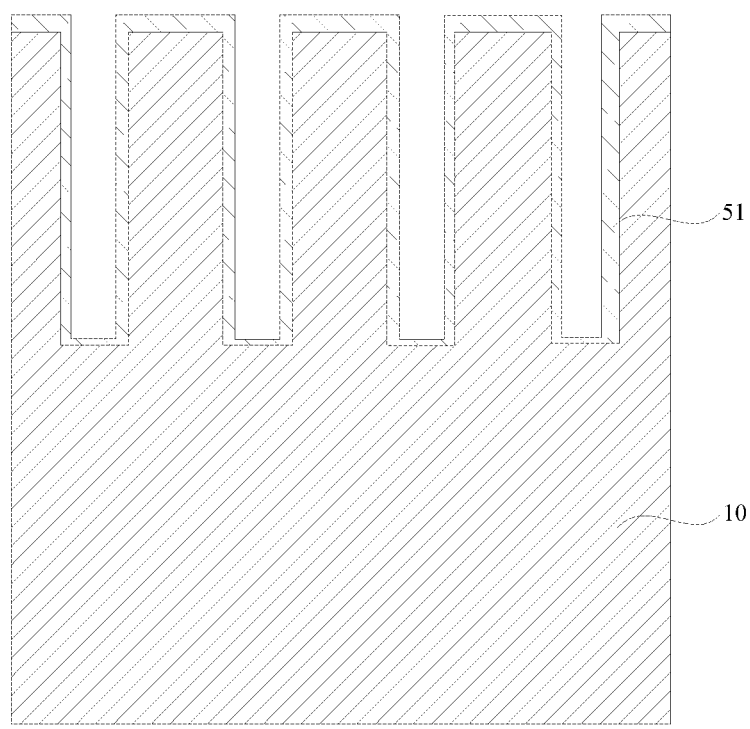
FIG. 16 is a schematic cross-sectional view of a structure taken along the B-B' direction after forming a first initial dielectric layer in a method for manufacturing a semiconductor structure according to an embodiment of the disclosure.

As shown in FIG. 16, after the first trenches 11 are formed, a first initial dielectric layer 51 may be deposited in each of the plurality of first trenches 11 through a deposition process. The first initial dielectric layer 51 is formed on the inner walls of the first trenches 11 and extends out of the first trenches 11 and covers the top surfaces of the active pillars 13.

The deposition process includes, but is not limited to, an ALD process and a PEALD process.

Figure 17:
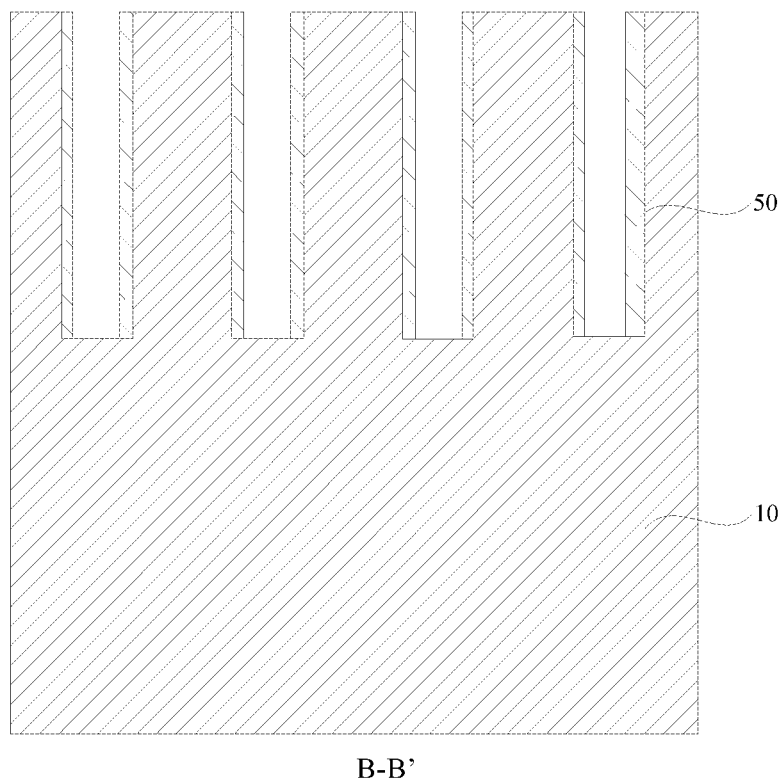
FIG. 17 is a schematic cross-sectional view of a structure taken along the B-B' direction after forming a first dielectric layer in a method for manufacturing a semiconductor structure according to an embodiment of the disclosure.

As shown in FIG. 17, the first initial dielectric layer 51 on the bottom portion of each first trench 11 and the first initial dielectric layer 51 on the top surface of each active pillar 13 are removed, so that the first initial dielectric layer 51 on the sidewall of each first trench 11 is remained to form the first dielectric layer 50.

In this operation, the active pillars 13 can be protected through the arrangement of the first dielectric layer 50, so that the active pillars are prevented from being damaged in the ion implantation process, thereby improving the performance of the semiconductor structure.

Figure 18:
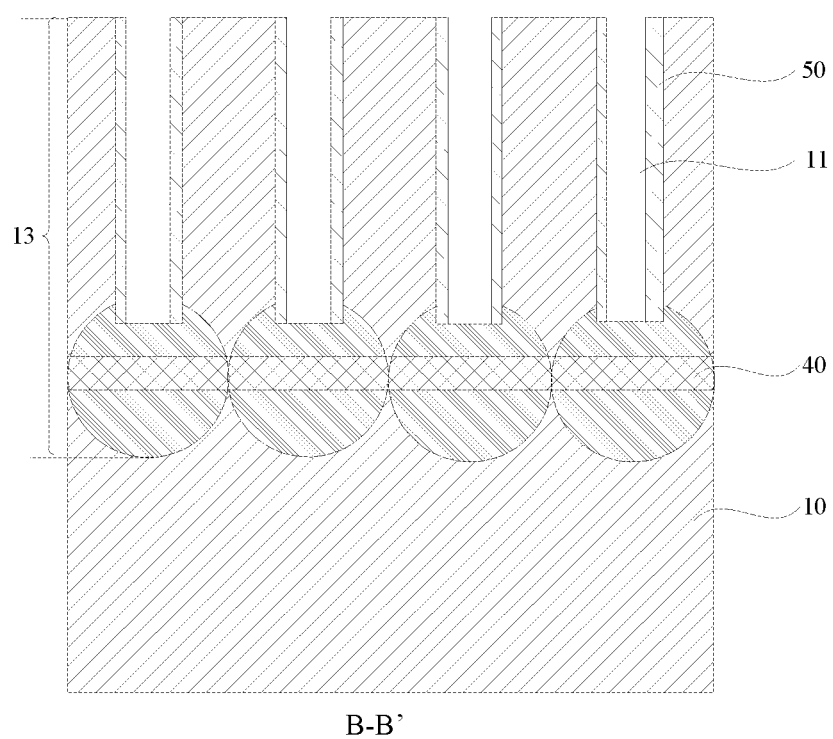
FIG. 18 is a schematic cross-sectional view of a structure taken along the B-B' direction after forming a bit line structure in a method for manufacturing a semiconductor structure according to an embodiment of the disclosure.

Next, as shown in FIG. 18, the bottom portion of each first trench 11 is doped to form a bit line structure 40 below the bottom portion of each first trench 11. The bit line structure 40 extends in the first direction. Each bit line structure 40 is connected to a different active pillar. The width of the bit line structure can be set by those skilled in the art, so that the bit line structure can connect two adjacent active pillars as much as possible and as evenly as possible, and the bit line structures are not connected to each other.

As an optical implementation of the bit line structure 40, metal germanium may be deposited into the first trench 11. Under certain reaction conditions, germanium reacts with silicon at the bottom portion of the active pillar 13 to form silicon germanium, so that the bottom portion of each active pillar 13 in the same second direction may form one bit line structure 40.

As an optical implementation of the bit line structure 40, metal cobalt may be deposited into the bottom portion of the first trench 11. Under certain reaction conditions, metal cobalt reacts with silicon at the bottom portion of the active pillar 13 to form cobalt silicide, so that the bottom portion of each active pillar 13 in the same second direction may form one bit line structure 40.

In some embodiments, with reference to FIG. 2 and FIG. 3, after the bit line structure 40 is formed, a second conductive layer 60 is formed on a side wall, which is arranged in a respective one of the plurality of first trenches, of each of the plurality of active pillars 13. In the section taken along the first direction, the second conductive layer 60 is arranged above the first isolation layer 30 and arranged in a respective one of the plurality of second trenches 12. In the section taken along the second direction, the second conductive layer 60 is arranged on a side of the first dielectric layer 50 away from the active pillar 13.

In this way, the second conductive layer 60 forms a word line extending in the second direction. The word line is configured for connecting all the active pillars arrayed in the second direction, so that a voltage is applied to the channel area of the active pillar 13 through the word line to control connection or disconnection between the source area and the drain area of the active pillar 13. A material of the second conductive layer 60 may include metal tungsten.

It should be noted that the process of forming the second conductive layer 60 in this embodiment may have various options. For example, a second initial conductive layer completely filling the first trench 11 and the second trench 12 is formed in the first trench 11 and the second trench 12, and then removing a portion of the second initial conductive layer in the first trench 11 along the second direction to remain the second initial conductive layer on the inner wall of the first trench to form the second conductive layer 60.

In some embodiments, with reference to FIG. 2 and FIG. 3, in the section taken along the first direction, a second isolation layer 70 is formed above the second conductive layer 60 in a respective one of the second trenches. In the section taken along the second direction, the second isolation layer 70 is formed between the sidewalls, which are arranged in a respective one of the plurality of first trenches 11, of two adjacent active pillars 13.

In this operation, the second isolation layer 70 may be formed in the first trench 11 and the second trench 12 through a deposition process, so that any two adjacent second conductive layers 60 can be insulated from each other through the second isolation layer 70.

Respective embodiments or implementation in the description are described in a progressive manner, each embodiment focuses on the difference from other embodiments, and the same and similar parts among the various embodiments are referenced to each other.

In the description of the specification, the descriptions made with reference to terms "an implementation", "some implementations", "exemplary implementation", "example", "specific example", "some examples" or the like refer to specific features, structures, materials or characteristics described in combination with the implementations or the examples are included in at least one implementation or example of the disclosure.

In the specification, the schematic representations of the above terms do not necessarily refer to the same implementation or example. Moreover, the specific features, structures, materials or characteristics described herein may be combined with each other in a proper manner in any one or more implementations or examples.

Finally, it should be noted that the above embodiments are merely used for describing rather than limiting the technical solutions of the present disclosure. Although the present disclosure is described in detail with reference to the foregoing embodiments, those of ordinary skill in the art should understand that the technical solutions specified in the above embodiments can still be modified, or some or all of the technical features therein can be equivalently substituted; and such modifications or substitutions do not make the essence of the corresponding technical solutions depart from the scope of the technical solutions of each of the embodiments of the present disclosure.

The invention claimed is:

1. A semiconductor structure, comprising:
    a substrate, wherein the substrate includes a plurality of first trenches extending in a first direction and a plurality of second trenches extending in a second direction, a plurality of active pillars are provided between the plurality of first trenches and the plurality of second trenches, and the first direction intersects with the second direction; and
    a plurality of first conductive layers, wherein each of the plurality of first conductive layers is arranged on each of sidewalls, which are arrayed in the first direction, of a respective one of the plurality of active pillars, the first conductive layer is arranged on a top surface of the active pillars, and there is a gap between a bottom surface of the first conductive layer facing the substrate and a bottom surface of the second trench.

2. The semiconductor structure according to claim 1, wherein
    each of the plurality of second trenches comprises a first isolation layer and a void.

3. The semiconductor structure according to claim 2, wherein
    the void is arranged below a respective one of the plurality of first conductive layers.

4. The semiconductor structure according to claim 2, wherein
    the void is arranged between two respective first conductive layers of the plurality of first conductive layers.

5. The semiconductor structure according to claim 2, wherein each of the plurality of second trenches comprises a first sub-trench and a second sub-trench, and the first sub-trench is arranged above the second sub-trench, and communicates with the second sub-trench.

6. The semiconductor structure according to claim 5, wherein
a cross-sectional area of the first sub-trench is greater than or equal to a cross-sectional area of the second sub-trench.

7. The semiconductor structure according to claim 5, wherein
each of the plurality of first conductive layers is arranged on a sidewall, which is arranged in the first sub-trench, of a respective one of the plurality of active pillars.

8. The semiconductor structure according to claim 2, wherein
a bit line structure is provided below a bottom portion of each of the plurality of first trenches, wherein the bit line structure extends in the first direction.

9. The semiconductor structure according to claim 8, wherein
a first dielectric layer and a second conductive layer are provided on a sidewall, which is arranged in a respective one of the plurality of first trenches, of each of the plurality of active pillars.

10. The semiconductor structure according to claim 9, wherein
in a section taken along the first direction, the second conductive layer is arranged above the first isolation layer and arranged in a respective one of the plurality of second trenches.

11. The semiconductor structure according to claim 10, further comprising
a second isolation layer, wherein in the section taken along the first direction, the second isolation layer is arranged above the second conductive layer and arranged in a respective one of the plurality of second trenches; and in a section taken along the second direction, the second isolation layer is arranged between sidewalls, which are arranged in a respective one of the plurality of first trenches, of two adjacent active pillars of the plurality of active pillars.

12. The semiconductor structure according to claim 1, wherein
a depth of each of the plurality of first trenches is less than a depth of each of the plurality of second trenches.

13. A method for manufacturing a semiconductor structure, comprising:
providing a substrate;
forming, in the substrate, a plurality of first trenches extending in a first direction and a plurality of second trenches extending in a second direction, wherein a plurality of active pillars are provided between the plurality of first trenches and the plurality of second trenches, and the first direction intersect with the second direction; and
forming a first conductive layer on each of sidewalls, which are arrayed in the first direction, of each of the plurality of active pillars, the first conductive layer is arranged on a top surface of the active pillars, and there is a gap between a bottom surface of the first conductive layer facing the substrate and a bottom surface of the second trench.

14. The method for manufacturing the semiconductor structure according to claim 13, wherein
in a section taken along the first direction, after a third isolation layer is formed at a bottom portion of each of the plurality of second trenches, the method further comprises: depositing a first initial conductive layer in each of the plurality of second trenches and on the third isolation layer, and removing a portion of the first initial conductive layer to remain the first initial conductive layer arranged on a sidewall, which is arranged in a respective one of the plurality of second trenches, of each of the plurality of active pillars, to form the first conductive layer.

15. The method for manufacturing the semiconductor structure according to claim 14, wherein
each of the plurality of second trenches comprises a first sub-trench and a second sub-trench, and wherein the method further comprising: forming, in the substrate, a plurality of first sub-trenches extending in the second direction, and forming the second sub-trench at a bottom portion of a respective one of the plurality of first sub-trenches, wherein the second sub-trench communicates with the respective one of the plurality of first sub-trenches.

16. The method for manufacturing the semiconductor structure according to claim 15, wherein
a cross-sectional area of the first sub-trench is greater than or equal to a cross-sectional area of the second sub-trench, and wherein the method further comprises: forming a first isolation layer and a void in each of the plurality of second trenches.

17. The method for manufacturing the semiconductor structure according to claim 16, further comprising:
forming a second conductive layer on a sidewall, which is arranged in a respective one of the plurality of first trenches, of each of the plurality of active pillars, wherein in a section taken along the first direction, the second conductive layer is arranged above the first isolation layer and arranged in a respective one of the plurality of second trenches.

18. The method for manufacturing the semiconductor structure according to claim 17, further comprising:
in the section taken along the first direction, forming, in each of the plurality of second trenches, a second isolation layer above the second conductive layer; and
in a section taken along the second direction, forming the second isolation layer between sidewalls, which are arranged in a respective one of the plurality of first trenches, of two adjacent active pillars of the plurality of active pillars.

19. The method for manufacturing the semiconductor structure according to claim 13, further comprising:
depositing a first initial dielectric layer in each of the plurality of first trenches; removing the first initial dielectric layer at a bottom portion of each of the plurality of first trenches to remain the first initial dielectric layer arranged on a sidewall of each of the plurality of first trenches to form a first dielectric layer; and doping the bottom portion of each of the plurality of first trenches to form a bit line structure below the bottom portion of each of the plurality of first trenches, wherein the bit line structure extends in the first direction.

* * * * *